(12) United States Patent
Ku et al.

(10) Patent No.: US 8,922,235 B2
(45) Date of Patent: Dec. 30, 2014

(54) METHOD AND SYSTEM FOR TESTING SEMICONDUCTOR DEVICE

(75) Inventors: Kie-Bong Ku, Gyeonggi-do (KR); Lee-Bum Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 616 days.

(21) Appl. No.: 13/150,782

(22) Filed: Jun. 1, 2011

(65) Prior Publication Data

US 2012/0153984 A1 Jun. 21, 2012

(30) Foreign Application Priority Data

Dec. 17, 2010 (KR) .................. 10-2010-0129946

(51) Int. Cl.
- *G01R 31/26* (2014.01)
- *G11C 29/50* (2006.01)
- *G11C 29/44* (2006.01)
- *G11C 29/08* (2006.01)

(52) U.S. Cl.
CPC ............. *G11C 29/50* (2013.01); *G11C 29/44* (2013.01); *G11C 29/08* (2013.01)
USPC .................................................. 324/762.01

(58) Field of Classification Search
CPC ......... G11C 29/08; G11C 29/50; G11C 29/44
See application file for complete search history.

(56) References Cited

U.S. PATENT DOCUMENTS

| | | | | |
|---|---|---|---|---|
| 5,233,610 A | * | 8/1993 | Nakayama et al. | 714/704 |
| 7,412,635 B1 | * | 8/2008 | Trimberger | 714/725 |
| 7,464,309 B2 | * | 12/2008 | Seo | 714/719 |
| 7,519,873 B2 | * | 4/2009 | Shin et al. | 714/703 |
| 7,587,643 B1 | * | 9/2009 | Chopra | 714/726 |
| 7,639,002 B1 | * | 12/2009 | Kejariwal et al. | 324/762.02 |
| 2005/0102595 A1 | * | 5/2005 | Seo | 714/736 |
| 2005/0289287 A1 | * | 12/2005 | Shin et al. | 711/1 |
| 2007/0022335 A1 | * | 1/2007 | Shin et al. | 714/718 |

FOREIGN PATENT DOCUMENTS

KR  1020050084793  8/2005

OTHER PUBLICATIONS

Office Action issued by the Korean Intellectual Property Office on Feb. 23, 2012.

\* cited by examiner

*Primary Examiner* — Tung X Nguyen
(74) *Attorney, Agent, or Firm* — IP & T Group LLP

(57) ABSTRACT

A method for testing a semiconductor device includes testing the semiconductor device in a plurality of operation modes sequentially, and programming the semiconductor device to operate in at least one of the operation modes when the semiconductor device passes the testing.

10 Claims, 3 Drawing Sheets

METHOD AND SYSTEM FOR TESTING SEMICONDUCTOR DEVICE

CROSS-REFERENCE TO RELATED APPLICATIONS

The present application claims priority of Korean Patent Application No. 10-2010-0129946, filed on Dec. 17, 2010, which is incorporated herein by reference in its entirety.

BACKGROUND

1. Field

Exemplary embodiments of the present invention relate to a method and system for testing a semiconductor device.

2. Description of the Related Art

As the integration degree of semiconductor devices including semiconductor memory devices increases rapidly, a semiconductor device may be provided with more than thousands of unit cells. The semiconductor device may not perform its whole operation even due to one defective cell among thousands of unit cells. However, it is quite inefficient in terms of production yield to discard the semiconductor device because of the failure occurring in a few unit cells. Here, a unit cell means a basic unit for performing an essential function of the semiconductor device. For example, a memory cell may operate as the unit cell in a semiconductor memory device and a processor may be the unit cell of a Central Processing Unit (CPU).

To prevent the semiconductor device from being discarded as described above, a variety of techniques have been developed and applied to the semiconductor device. For instance, a semiconductor memory device includes redundancy cells together with memory cells. Even if some of the memory cells are defective, the semiconductor memory device can be used by repairing them with the redundancy cells. Taking an example of the method of repairing a defective memory cells using a redundancy cell, a spare row unit and a spare column unit are prepared for each predetermined cell array and a row unit or a column unit including the defective memory cell is replaced with the spare row or column unit.

After the processing of manufacturing a wafer is completed, a defective memory cell is selected out through a test. Then, a program for changing the address of the defective memory cell with the address of a spare cell is executed in an internal circuit. Therefore, when the semiconductor device is actually used and the address signal corresponding to a defective memory cell line is inputted, the address signal is changed with the address signal of a spare line. In this way, although some memory cells of a semiconductor device are turned out to have a fault, the entire semiconductor device may be prevented from being discarded.

The above method of using a redundancy cell is widely used but it may increase a chip area because the memory device should include memory cells more than the number of memory cells needed for their essential functions, e.g., the data storage. Therefore, other methods for repairing the defective cells of a semiconductor device are being developed.

The method of replacing a defective cell with a redundancy cell may be performed by using diverse kinds of fuses. Also, the semiconductor device may prevent its operation characteristics from being degraded due to temperature and process by using diverse kinds of fuses.

Meanwhile, the test of a semiconductor device may be performed based on the specification which defines general operation characteristics of the semiconductor device. Semiconductor devices may be designed to have characteristics better than those of the specification. Therefore, the semiconductor memory device may be tested based on diverse operation characteristics including its general operation characteristics by using diverse kinds of fuses.

SUMMARY

An embodiment of the present invention is directed to a semiconductor device testing method which detects an operation environment where a defective semiconductor device may perform a proper operation and programs the semiconductor device to operate in the detected operation environment.

Another embodiment of the present invention is directed to a semiconductor device testing method which detects an operation environment for a high performance of a semiconductor device and programs the semiconductor device to operate in the detected operation environment.

In accordance with an embodiment of the present invention, a method for testing a semiconductor device includes: testing the semiconductor device in a plurality of operation modes sequentially programming the semiconductor device to operate in at least one of the operation modes when the semiconductor device passes the testing.

In accordance with another embodiment of the present invention, a semiconductor device test system includes: an operation result decider configured to test and determine whether the semiconductor satisfies a condition set for an operation mode of a plurality of operation modes based on an output of the semiconductor device; and a set information controller configured to change set information based on a determination result of the operation result decider and transmit the set information to the semiconductor device, wherein the semiconductor device is configured to operate in at least one of the plurality of operation modes in response to the set information during a test operation.

In accordance with further embodiment of the present invention, a method for testing a semiconductor device includes: testing the semiconductor device in a normal operation mode; and testing the semiconductor device in a first operation mode if the semiconductor device passes the testing in the normal operation mode, where if the semiconductor device passes the testing in the first operation mode, the semiconductor device is tested in a second operation mode.

DETAILED DESCRIPTION

Figure 1:
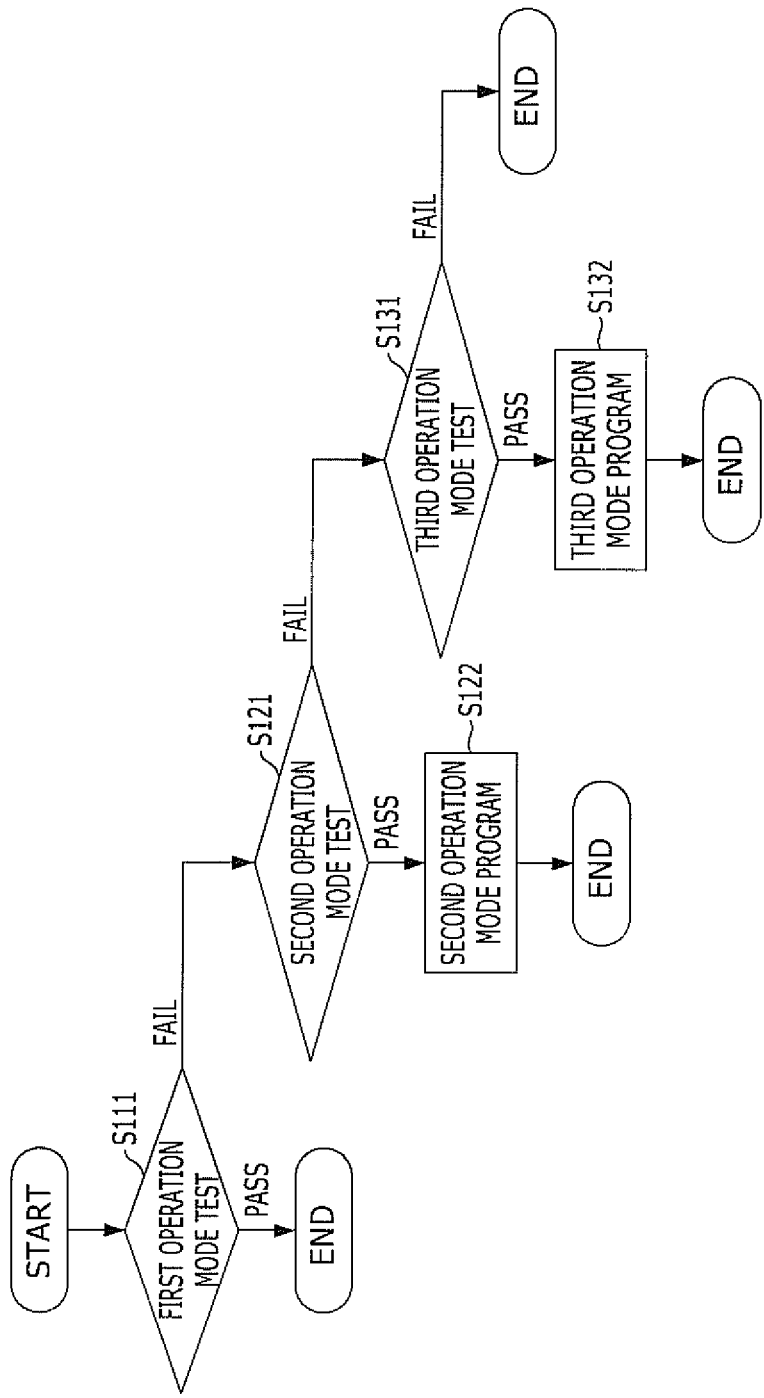
FIG. 1 is a flowchart describing a method for testing a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, a defective semiconductor device means a semiconductor device having characteristics, or performance, inadequate to perform a proper operation in a corresponding operation mode. It does not mean that the semiconductor device cannot operate at all. The conditions for a semiconductor device to perform a proper operation and the characteristics, or performance, of the semiconductor device have the following relationship. As the semiconductor device may have poor characteristics, it may perform a proper operation under less strict conditions. Conversely, a semiconductor device performing a proper operation under tighten conditions may have excellent characteristics.

FIG. 1 is a flowchart describing a method for testing a semiconductor device in accordance with an embodiment of the present invention.

Although a plurality of semiconductor devices are fabricated through the same process, the performances of the semiconductor devices may be different from each other. The semiconductor device having an excellent performance in a certain operation range (e.g., a supply voltage or temperature range) may not properly operate in other operation ranges. Therefore, the whole operation range allowable to the semiconductor device is separated into predetermined sections and a test operation is performed for each section. And then, the semiconductor devices may operate in respective sections where they successfully pass the test operation. The test operation is to be performed in order from small operation range toward wider operation range in order to make each semiconductor device operate in an appropriate operation range.

As illustrated in FIG. 1, the method of testing a semiconductor device includes testing the semiconductor device to see whether the semiconductor device performs a proper operation in a first operation mode in step S111; when the semiconductor device does not perform a proper operation in the first operation mode, testing the semiconductor device to see whether the semiconductor device performs a proper operation in a second operation mode in step S121; when the semiconductor device performs a proper operation in the second operation mode, programming the semiconductor device to operate in the second operation mode in step S122; when the semiconductor device does not perform a proper operation in the second operation mode, testing the semiconductor device to see whether the semiconductor device performs a proper operation in a third operation mode in step S131; and when the semiconductor device performs a proper operation in the third operation mode, programming the semiconductor device to operate in the third operation mode in step S132.

Referring to FIG. 1, the method for testing a semiconductor device is described as follows.

The method for testing a semiconductor device not only tests whether the semiconductor device performs a proper operation but also programs the semiconductor device to perform a proper operation when the semiconductor device does not perform a proper operation. The method of testing a semiconductor device and a method for programming the semiconductor device are described as follows.

When a semiconductor device begins to be tested, it is tested at first in step S111 whether the semiconductor device performs an operation properly in a first operation mode. Here, the first operation mode means an operation environment where the semiconductor device is primarily supposed to perform an operation properly. The first operation mode may be determined by a user or the specification. Hereafter, the step of testing the semiconductor device to see whether the semiconductor device performs an operation properly in the first operation mode is referred to as a first operation mode testing step S111.

A memory device having CAS latency (CL) of '7' is described as an example of the above semiconductor device as follows. The CAS latency means a waiting time taken from a moment when a memory controller applies a read command to the memory device to a moment when the memory device performs a read operation. The CAS latency is determined in consideration of the time taken for preparing the memory device to output a data from the inside of the memory device. When the CAS latency is 7, the memory device transfers a data to the memory controller after 7 clocks pass from the moment when a read command is applied from the memory controller.

When the CAS latency is 7 in the first operation mode testing step S111, the memory device performs a proper operation if it does not have a fault. That is, the memory device passes in the first operation mode testing step S111. However, if the memory device has a fault and it takes a time of more than 7 clocks to prepare the output of a data, the memory device fails in the first operation mode testing step S111 and the logic flow goes to the subsequent step.

When the semiconductor device fails in the first operation mode testing step S111, the test operation is performed in a second operation mode to see whether the semiconductor device performs a proper operation in the second operation mode. This step of process is referred to as a second operation mode testing step S121. In the second operation mode testing step S121, the operation of the semiconductor device is tested in an operation environment which is less strict than that of the first operation mode testing step S111. The less strict/easier operation environment means an environment of conditions that the semiconductor device may more easily perform a proper operation or it may have higher possibility in performing the proper operation. Conversely, the semiconductor device may have worse characteristics than a semiconductor device operating in the first operation mode.

According to the above example, the memory device failing in the first operation mode testing step S111 is tested in the second operation mode testing step S121. That is, the memory device may be tested under the conditions that the CAS latency is 8. The longer the CAS latency is, the more time the memory device can use for outputting a data. Therefore, long CAS latency is favorable in performing the proper operation.

When the semiconductor device performs a proper operation in the second operation mode, the semiconductor device passes in the second operation mode testing step S121 and proceeds to a second operation mode programming step S122, which is described as follows. When the semiconductor device does not perform a proper operation in the second operation mode, the semiconductor device fails in the second operation mode testing step S121 and proceeds to a third operation mode testing step S131, which is also described as follows.

The second operation mode programming step S122 is a step of programming the semiconductor device to always operate in the second operation mode when the semiconductor device passes in the second operation mode testing step S121. 'Set information' for making the semiconductor device to operate in the second operation mode may be programmed in a storage inside the semiconductor device. The semiconductor device may retain the 'set information' stored therein even though power source is cut off.

The structure for storing the 'set information' may be realized in diverse forms, such as a fuse circuit, an anti-fuse circuit, Read Only Memory (ROM), a non-volatile memory and the like. When the second operation mode programming step S122 is completed, the semiconductor device operates not in the first operation mode but in the second operation mode. For example, the above memory device performs a general operation under the conditions that the CAS latency is 8.

When the semiconductor device fails in the second operation mode testing step S121, the semiconductor device proceeds to a third operation mode testing step S131 where whether the semiconductor device performs a proper operation in a third operation mode is tested. In the third operation mode testing step S131, it is tested whether the semiconductor device performs a proper operation in an operation environment which is less strict than that of the second operation mode. Here, the less strict/easier operation environment means the operation environment where the semiconductor device may more easily perform a proper operation. In other words, the possibility that the semiconductor device performs a proper operation is higher in the third operation mode than in the second operation mode. Also, the semiconductor device may have poorer characteristics than a semiconductor device operating in the second operation mode.

According to the above example, the memory device failing in the second operation mode testing step S121 is tested in the third operation mode testing step S131. That is, the memory device may be tested under the conditions that the CAS latency is 9.

When the semiconductor device performs a proper operation in the third operation mode, the semiconductor device passes in the third operation mode testing step S131 and proceeds to a third operation mode programming step S132, which is described as follows. When the semiconductor device does not perform a proper operation in the third operation mode, the semiconductor device fails in the third operation mode testing step S131.

The third operation mode programming step S132 is a step of programming the semiconductor device to always operate in the third operation mode when the semiconductor device passes in the third operation mode testing step S131. 'Set information' for making the semiconductor device to operate in the third operation mode may be programmed in a storage inside the semiconductor device. When the third operation mode programming step S132 is completed, the semiconductor device generally operates in the third operation mode. For example, the above memory device performs a general operation under the conditions that the CAS latency is 9.

The test operation of the semiconductor device is terminated when the following conditions are satisfied.

First, when the semiconductor device passes in the first operation mode testing step S111, the test operation of the semiconductor device is terminated. Here, since the semiconductor device passes in the test operation, there is no fault in the semiconductor device. The fact that the semiconductor device performs a proper operation in the first operation mode naturally means that the semiconductor device performs a proper operation in the second operation mode and the third operation mode as well. Therefore, the semiconductor device is not to be tested in the second operation mode and the third operation mode. Therefore, whether the semiconductor device properly operates in the second operation mode and the third operation mode is not tested and the test operation of the semiconductor device is terminated.

Second, when the semiconductor device passes in the second operation mode testing step S121 or the third operation mode testing step S131, the test operation is terminated after the second operation mode programming step S122 or the third operation mode programming step S132 is completed. This is a case where the semiconductor device has some faults, but it may perform a proper operation if the operation environment is easier to satisfy, and thus the semiconductor device may be prevented from being discarded. Therefore, when the semiconductor device operates after the test operation is terminated, the semiconductor device operates in the operation mode programmed in the test operation.

Finally, when the semiconductor device fails in the third operation mode testing step S131, the test operation is terminated. The fact that the semiconductor device does not perform a proper operation in the third operation mode means that the semiconductor device does not meet the minimal condition for being prevented. In this case, the semiconductor device is not prevented from being discarded but regarded as a defective semiconductor device.

When the semiconductor device is tested and there is no fault in the semiconductor device, the semiconductor device passes in the test. When the semiconductor device has a fault, the operation condition of the semiconductor device is less strict and if the semiconductor device performs a proper operation in the loosened operation condition, the loosened operation condition is stored in the semiconductor device. Therefore, the semiconductor device having a fault is prevented from being discarded by operating the semiconductor device in the loosened operation condition when the semiconductor device is used. The loosened operation condition corresponds to the second operation mode or the third operation mode in the above description, and the number of operation modes may be increased without restriction according to how the semiconductor device is designed.

The semiconductor device testing method may be applied not only to the above-described semiconductor device, but also to all semiconductor devices and the operation conditions thereof. For example, the semiconductor device testing method may be applied to other latencies of a memory device other than the CAS latency described above.

Also, when the semiconductor device is a computing device, the testing method of the present invention may be applied to the process, voltage and temperature (PVT) condition under which the computing device is to operate. To be specific, the PVT condition may change so that the operation of the computing device become slow as it goes from the first operation mode toward the third operation mode, or a power source voltage supplied to the computing device may become higher as it goes from the first operation mode toward the third operation mode.

Referring back to FIG. 1, the method for testing a semiconductor device is described in detail.

As shown in the drawing, the semiconductor device testing method includes: testing whether the semiconductor device performs a proper operation in step S111; when the semiconductor device does not perform a proper operation in a first operation mode, sequentially testing whether the semiconductor device performs a proper operation in a plurality of test modes, e.g., the second operation mode and the third operation mode, in steps S121 and S131; and when the semiconductor device performs a proper operation in any one test mode among the test modes, e.g., the second operation mode and the third operation mode, programming the semiconductor device to operate in the test mode where the semiconductor device performs a proper operation in steps S122 and S132.

Here, the first operation mode correspond to a normal mode of the semiconductor device, and the second operation mode and the third operation mode correspond to the multiple test modes.

When the semiconductor device performs a proper operation in the normal mode, that is, when the semiconductor device passes in the first operation mode testing step S111, the test operation is terminated without testing the semiconductor device in the multiple test modes, e.g., the second operation mode and the third operation mode.

The multiple test modes, e.g., the second operation mode and the third operation mode, have easier conditions for the semiconductor device to perform a proper operation in sequence. The fact that the condition becomes easy for the semiconductor device to perform a proper operation means that the condition is loosened so that the semiconductor device performs a proper operate easily, as mentioned with reference to FIG. 1.

Figure 2:
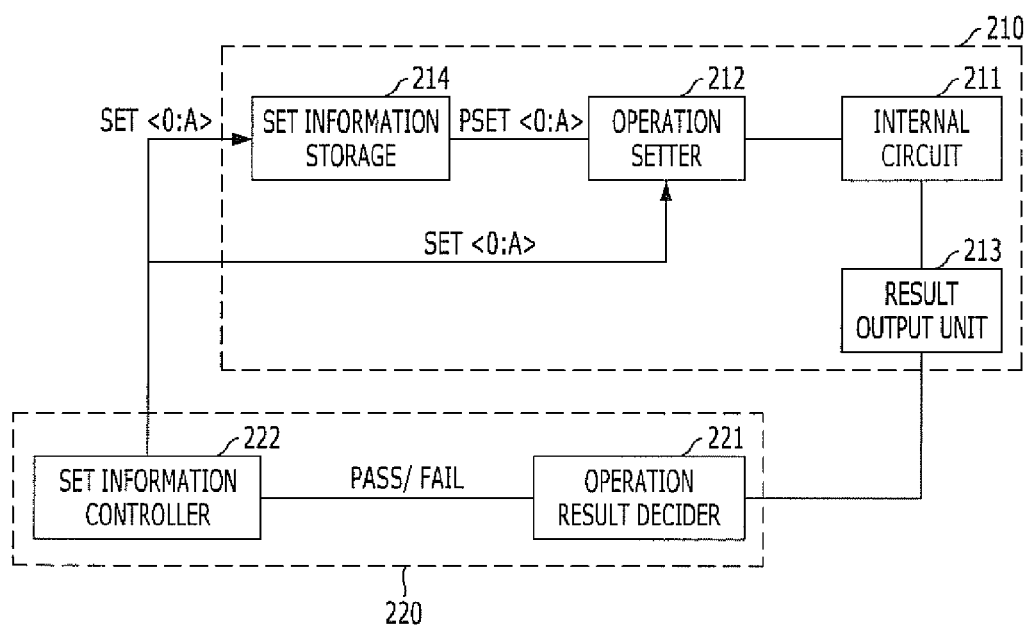
FIG. 2 is a block view illustrating a semiconductor device test system in accordance with an embodiment of the present invention.

FIG. 2 is a block view illustrating a semiconductor device test system in accordance with an embodiment of the present invention.

A semiconductor device test system includes a semiconductor device 210 and a test device 220. The semiconductor device 210 includes an internal circuit 211, an operation setter 212, a result output unit 213, and a set information storage 214. The test device 220 includes an operation result decider 221 and a set information controller 222. The internal circuit 211 performs a number of functions for the semiconductor device 210. The operation setter 212 sets the internal circuit 211 to operate in any one operation mode among a plurality of operation modes during a test operation. The result output unit 213 outputs an operation result of the internal circuit 211. The set information storage 214 stores set information SET<0:A> corresponding to an operation mode among the multiple operation modes where the internal circuit 211 performs a proper operation. The operation result decider 221 decides whether the internal circuit 211 performs a proper operation in response to an output of the result output unit 213. The set information controller 222 changes the set information SET<0:A> based on the output of the operation result decider 221 or controls the set information storage 214 to store the set information SET<0:A>.

Referring to FIGS. 1 and 2, the operation of the semiconductor device test system is described as follows. Here, the multiple operation modes include a first operation mode, a second operation mode, and a third operation mode, which are described above with reference to FIG. 1. Also, the functions of the semiconductor device 210 may be any reasonably suitable functions of a semiconductor device, such as a computation function in case of a central processing unit (CPU), a function of storing data and inputting/outputting data in case of a memory device, and a function of converting a digital signal into an analog signal in case of a digital-to-analog converter.

In the first operation mode testing step S111, the set information controller 222 applies the set information SET<0:A> corresponding to the first operation mode to the operation setter 212. The operation setter 212 receives the set information SET<0:A> and controls the internal circuit 211 to operate in the first operation mode. Then the result output unit 213 outputs an operation result of the internal circuit 211, and the operation result decider 221 generates a pass signal or a failure signal in response to the operation result of the internal circuit 211. When the internal circuit 211 performs a proper operation in the first operation mode, the pass signal PASS is enabled to thereby terminate the test operation of the semiconductor device. When the internal circuit 211 does not perform a proper operation in the first operation mode, the failure signal FAIL is enabled to proceed the test operation into the second operation mode testing step S121.

In the second operation mode testing step S121, the set information controller 222 changes the set information SET<0:A> to correspond to the second operation mode and applies the changed set information SET<0:A> to the operation setter 212. The operation setter 212 receives the set information SET<0:A> and controls the internal circuit 211 to operate in the second operation mode. When the result output unit 213 outputs an operation result of the internal circuit 211, the operation result decider 221 generates a pass signal or a failure signal in response to the operation result of the internal circuit 211.

When the internal circuit 211 performs a proper operation in the second operation mode, the pass signal is enabled. When the pass signal is enabled, the set information storage 214 stores the set information SET<0:A> corresponding to the second operation mode therein. When the set information storage 214 stores the set information SET<0:A> corresponding to the second operation mode, the test operation of the semiconductor device is terminated. When the semiconductor device operate in a normal mode, the operation setter 212 controls the internal circuit 211 to operate in the second operation mode in response to the pre-stored set information PSET<0:A> stored in the set information storage 214. Here, the pre-stored set information PSET<0:A> is the same as the set information SET<0:A> corresponding to the second operation mode.

When the internal circuit 211 does not perform a proper operation in the second operation mode, the failure signal is enabled and the logic flow proceeds to the third operation mode testing step S131.

In the third operation mode testing step S131, a process of deciding whether the internal circuit 211 performs a proper operation and a process of storing the set information SET<0:A> corresponding to the third operation mode in the set information storage 214 when the internal circuit 211 performs a proper operation are the same as above. Here, the medium for storing the set information SET<0:A> in the set information storage 214 may include a fuse circuit, an anti-fuse circuit, ROM, a non-volatile memory device and the like.

When the internal circuit 211 does not perform a proper operation in the third operation mode, it is finally regarded that the semiconductor device has a fault and the set information controller 222 does not apply any changed set information SET<0:A> to the semiconductor device and terminates the test operation of the semiconductor device.

The semiconductor device test system first tests whether the semiconductor device performs a proper operation in several operation modes. As a result of the test, when the operation mode where the semiconductor device performs a proper operation, which is referred to as a normal operation mode hereafter, is found out, the normal operation mode is stored in the semiconductor device and the test operation is terminated. The semiconductor device operates in the "normal operation mode" based on the set information SET<0:A> stored therein. In this semiconductor device test system, it may be prevented that a semiconductor device is regarded as having a fault and not used because the semiconductor device does not performs a proper operation under a particular condition. Therefore, the technology of the present invention has an advantage in that a semiconductor device having a fault of a predetermined range may be prevented from being discarded.

Figure 3:
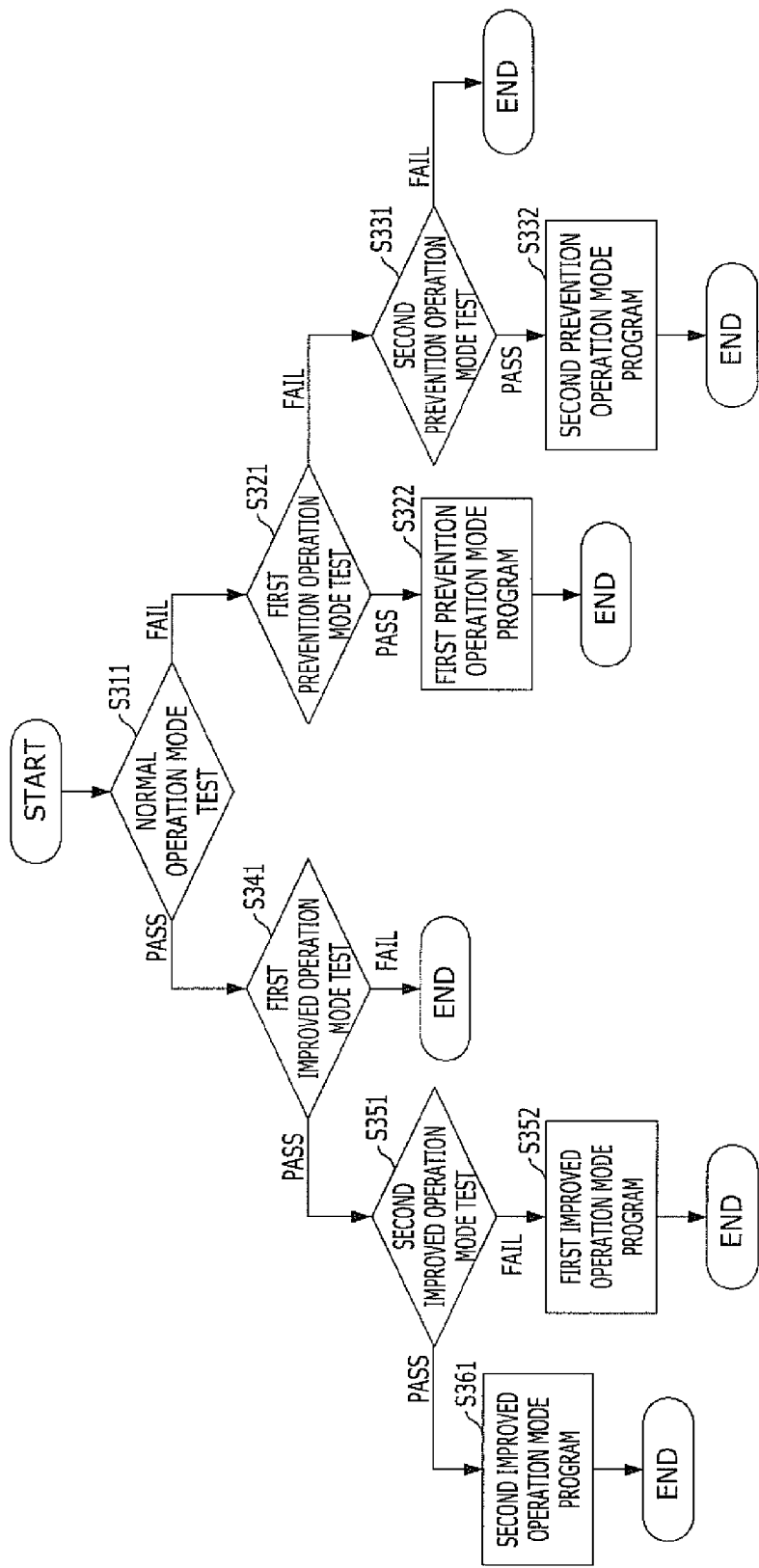
FIG. 3 is a flowchart describing a method for testing a semiconductor device in accordance with another embodiment of the present invention.

FIG. 3 is a flowchart describing a method for testing a semiconductor device in accordance with another embodiment of the present invention.

In this case, differently from the embodiment shown in FIG. 1, a test operation is performed to use the semiconductor device with better characteristics. The fact that a semiconductor device operates with better characteristics means that the semiconductor device operates in narrower operation condition range. Therefore, the characteristics of the semiconductor device may increase up to the limit by testing the semiconductor device while narrowing the operation condition range of the semiconductor device and making the semiconductor device operate in the operation condition range when the semiconductor device reaches the limit of its performance.

As illustrated in FIG. 3, the method for testing a semiconductor device includes: testing the semiconductor device to see whether the semiconductor device performs a proper operation in a normal operation mode in step S311; when the semiconductor device performs a proper operation in the normal operation mode, testing the semiconductor device to see whether the semiconductor device performs a proper operation in a first improved operation mode in step S341; when the semiconductor device performs a proper operation in the first improved operation mode, testing the semiconductor device to see whether the semiconductor device performs a proper operation in a second improved operation mode in step S351; and when the semiconductor device performs a proper operation in the second improved operation mode, programming the semiconductor device to operate in the second improved operation mode in step S361.

Hereafter, the method for testing a semiconductor device is described with reference to FIG. 3.

The semiconductor device testing method in accordance with the embodiment of the present invention includes not only testing the semiconductor device to see whether the semiconductor device performs a proper operation but also programming the semiconductor device to perform a proper operation.

When the test operation begins, it is tested first whether the semiconductor device performs a proper operation in the normal operation mode in step S311. The normal operation mode is an operation mode for testing the semiconductor device to see whether the semiconductor device performs an operation proper to the specification. Hereafter, the step of testing the semiconductor device to see whether the semiconductor device operates properly in the normal operation mode is referred to as a normal operation mode testing step S311.

When the semiconductor device passes in the normal operation mode testing step S311, it is tested whether the semiconductor device performs a proper operation in the first improved operation mode in step S341. This step is referred to as a first improved operation mode testing step S341. The first improved operation mode has a more difficult condition for the semiconductor device to perform a proper operation than the normal operation mode. Therefore, the semiconductor device operating in the first improved operation mode may have better characteristics than a semiconductor device operating in the normal operation mode. According to the example described in FIG. 1, the first improved operation mode may be an operation mode of a memory device where the CAS latency is 6. To take another example, it may be an operation mode where a semiconductor device operates at a lower supply voltage than the voltage in the normal operation mode.

When the semiconductor device does not perform a proper operation in the first improved operation mode, the test operation of the semiconductor device is terminated and the semiconductor device operates in the normal mode. Since the default value of the operation mode of the semiconductor device is the normal operation mode, the semiconductor device is not to be programmed to operate in the normal operation mode.

When the semiconductor device passes in the first improved operation mode testing step S341, it is tested whether the semiconductor device performs a proper operation in the second improved operation mode in step S351. This step is referred to as a second improved operation mode testing step S351. The second improved operation mode has a more difficult condition for the semiconductor device to perform a proper operation than the first improved operation mode. Therefore, the semiconductor device operating in the second improved operation mode may have better characteristics than a semiconductor device operating in the first operation mode. For example, the second improved operation mode may be an operation mode of a memory device where the CAS latency is 5. To take another example, it may be an operation mode where a semiconductor device operates at a lower supply voltage than the voltage in the first operation mode.

When the semiconductor device passes in the second improved operation mode testing step S351, the semiconductor device is programmed to operate in the second improved operation mode in step S361. This step is referred to as a second improved operation mode programming step S361. The semiconductor device may be programmed in such a manner that set information SET<0:A> for setting the semiconductor device to operate in the second improved operation mode is stored in the storage inside a semiconductor device. The semiconductor device is not to lose the set information SET<0:A> stored therein although a power supply is cut off.

When the semiconductor device fails in the second improved operation mode testing step S351, the semiconductor device is programmed to always operate in the first improved operation mode in step S352. This step is referred to as a first improved operation mode programming step S352. The programming method is the same as the second improved operation mode programming step S361.

According to the semiconductor device testing method in accordance with the embodiment of the present invention, the performance of the semiconductor device may be drawn out up to its limit. The operation conditions of semiconductor device change to make the semiconductor device perform a proper operation with more difficulty. When the semiconductor device becomes unable to perform a proper operation in a certain condition of changed operation conditions, the semiconductor device is programmed to operate in the preceding operation condition. This method may increase the characteristics of the semiconductor device up to its limit. Therefore, it is obvious to those skilled in the art that the second improved operation mode may not be the final test operation mode and the number of improved operation modes may be increased for better operation characteristics of the semiconductor device.

In FIG. 3, the test operation performed following the pass in the normal operation mode testing step S311 is a test operation for improving the characteristics of the semiconductor device.

In FIG. 3, the test operation performed following the failure in the normal operation mode testing step S311 is a test for preventing the semiconductor device from being discarded. The test for preventing the semiconductor device from being discarded is performed in the same method as the semiconductor device testing method described with reference to FIG. 1. The step S311 is the same as the step S111 and the step S321 is the same as the step S121, while the step S322 is the same as the step S122 and the step S331 is the same as the step S131. Also, the step S332 is the same as the step S132. Moreover, the normal operation mode is the same as the first operation mode, and a first prevention operation mode is the same as the second operation mode. A second prevention operation mode is the same as the third operation mode. Therefore, the first prevention operation mode is an operation mode where the semiconductor device is more likely to perform a proper operation than in the normal operation mode, and the second prevention operation mode is an operation mode where the semiconductor device is more likely to perform a proper operation than in the first prevention operation mode.

This testing method may be performed to improve the characteristics of a semiconductor device when the performance of the semiconductor device is higher than the level decided by a user, for example, a specification. Also, when the performance of a semiconductor device is lower than the level decided by the user, the testing method may be performed to prevent the semiconductor device from being discarded although the characteristics of the semiconductor device may be degraded.

The semiconductor device test method may include the normal operation mode testing step S311 and steps subsequent to the pass in the normal operation mode testing step S311. The semiconductor device test method improves the characteristics of the semiconductor device.

When the semiconductor device does not perform a proper operation in the normal operation mode testing step S311 or the first improved operation mode testing step S341, the test operation of the semiconductor device is terminated. When the semiconductor device does not perform a proper operation in the second improved operation mode testing step S351, which means a failure, the test operation of the semiconductor device is terminated after the first improved operation mode programming step S352.

According to an embodiment of the present invention, a semiconductor device may perform a test operation by changing the operation environment of the semiconductor device when the semiconductor device turns out to have a fault and may be programmed to operate in an operation environment where the semiconductor device performs a proper operation.

Also, the characteristics of the semiconductor device may be improved by detecting an operation environment where the semiconductor device may perform its operation maximally and programming the semiconductor device to operate in the detected operation environment.

While the present invention has been described with respect to the specific embodiments, it will be apparent to those skilled in the art that various changes and modifications may be made without departing from the spirit and scope of the invention as defined in the following claims.

What is claimed is:

1. A method for testing a semiconductor device, comprising:
    testing the semiconductor device in a plurality of operation modes sequentially; and
    programming the semiconductor device to operate in at least one of the operation modes when the semiconductor device passes the testing.

2. The method of claim 1, wherein the testing of the semiconductor device in the plurality of test modes sequentially comprises testing an operation of the semiconductor device in a first operation mode.

3. The method of claim 2, further comprising:
    terminating the testing of the semiconductor device if the semiconductor passes the testing in the first operation mode; and
    testing the operation of the semiconductor device in a second operation mode if the semiconductor device fails the testing in the first operation mode.

4. The method of claim 3, further comprising:
    programming the semiconductor device to operate in the second operation mode if the semiconductor device passes the testing in the second operation mode; and
    testing the operation of the semiconductor device in a third operation mode if the semiconductor device fails the testing in the second operation mode.

5. The method of claim 4, further comprising:
    programming the semiconductor device to operate in the third operation mode if the semiconductor device passes the testing in the third operation mode; and
    terminating the testing of the semiconductor device if the semiconductor device fails the testing in the third operation mode.

6. The method of claim 4, wherein conditions to pass for the semiconductor device become progressively easier in going from the first operation mode to the third operation mode.

7. The method of claim 1, where the operation modes includes a normal operation mode and a test operation mode of the semiconductor device.

8. The method of claim 1, further comprising terminating the testing of the semiconductor device when the semiconductor device passes the testing in at least one of the operation modes.

9. The method of claim 1, wherein conditions to pass for the semiconductor device become progressively easier in going from the first one to the last one of the operation modes.

10. The method of claim 1, further comprising terminating the testing of the semiconductor device when the semiconductor device fails the testing in the plurality of operation modes.

* * * * *